United States Patent [19]

Honda

[11] Patent Number: 4,893,047
[45] Date of Patent: Jan. 9, 1990

[54] ULTRASONIC DRIVING DEVICE
[75] Inventor: Keisuke Honda, Aichi, Japan
[73] Assignee: Honda Electronic Co., Ltd., Aichi, Japan
[21] Appl. No.: 244,917
[22] Filed: Sep. 14, 1988
[51] Int. Cl.⁴ .............................................. H01L 41/08
[52] U.S. Cl. ................................... 310/323; 310/366; 310/369
[58] Field of Search ............... 310/323, 328, 369, 366, 310/333

[56] References Cited
U.S. PATENT DOCUMENTS
4,019,073 4/1977 Vishnevsky et al. ............ 310/333 X
4,634,916 1/1987 Okada et al. ..................... 310/328 X
4,752,711 6/1988 Tsukimoto et al. ............. 310/328 X Primary Examiner—Mark O. Budd
Attorney, Agent, or Firm—Burgess, Ryan and Wayne

[57] ABSTRACT

A stator consists of a cylindrical piezoelectric vibrator and electrodes respectively divided in two in its inside and outside portions. When alternative current voltage is applied to respective one of divided electrodes in the inside and outside portions, reversible progressive waves generate on the end and side portions of the stator. When a rotary member is combined with the end or side portion of the stator, the rotary member can reversibly be moved.

8 Claims, 6 Drawing Sheets

PRIOR ART

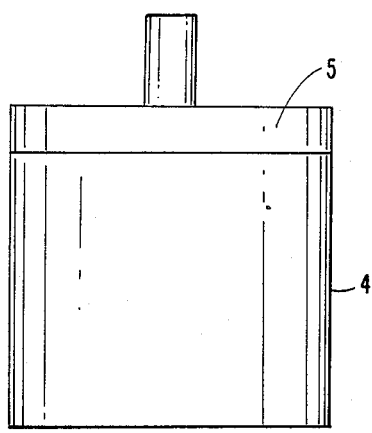
F I G. 6
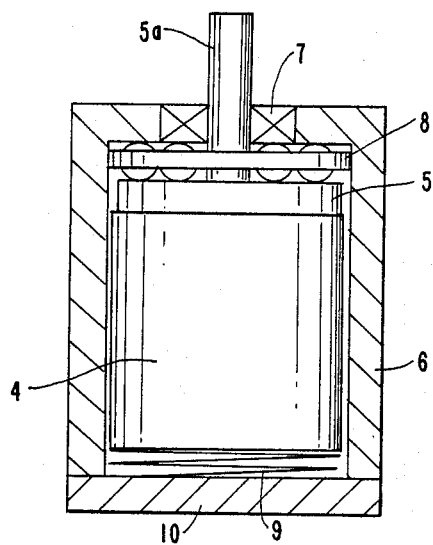
F I G. 7

ULTRASONIC DRIVING DEVICE

BACKGROUND OF THE INVENTION

The present invention relates to an ultrasonic driving device comprising a stator consisting of a cylindrical piezoelectric vibrator having divided electrodes.

In a known ultrasonic motor using a piezoelectric vibrator, two groups of electrodes are attached to one end of a ring type piezoelectric ceramic, the two group of electrodes are so positioned that standing waves respectively generated by the two groups of electrodes are lifted every $\pi/2$ in each position. The parts of the ring type piezoelectric vibrator corresponding to the electrode are alternately polarized in reverse. Also, the two groups of the electrodes are respectively connected to two oscillators for respectively generating alternating current voltages having a $\pi/2$ phase shift from each other. When the alternating current voltages from the two oscillators are respectively applied to the two groups of electrodes, the two standing waves having a $\pi/2$ phase shift from each other generated on the surface of the ring type piezoelectric vibrator and then progressive waves owing to a compound of the two standing waves generated on the surfaces of the ring type piezoelectric vibrator. Therefore, when a rotary member is put on the ring type piezoelectric vibrator and the rotary member is strongly pressed to the ring type piezoelectric vibrator, the rotary member is rotated by the progressive waves.

In prior ultrasonic motor, since the the ring type piezoelectric vibrator must be polarized in many portions thereof and the two oscillators must be connected to the electrodes, the composition of the ring type piezoelectric vibrator is complex and the cost of the ultrasonic motor becomes expensive.

SUMMARY OF THE INVENTION

It is, therefore, the primary object of the present invention to provide an ultrasonic driving device having a simple composition.

It is another object of the present invention to provide an ultrasonic driving device having a stator consisting of a cylindrical piezoelectric vibrator provided with divided electrodes in inside and outside portions thereof.

It is another object of the present invention to provide an ultrasonic driving device in which gaps between divided electrodes in the inside and outside portions are shifted from each other.

In order to accomplish the above and other objects, the present invention comprises a stator having a cylindrical piezoelectric vibrator and divided electrodes in its inside and outside portions, and a rotary member composed on one end or a side portion of the stator, alternating current voltage being respectively applied to one or more electrodes in the inside and outside portions of the cylindrical piezoelectric vibrator.

BRIEF DESCRIPTION OF THE DRAWINGS

FIG. 6 shows a simple view of an ultrasonic driving device according to the present invention.

FIG. 7 shows a side view of an ultrasonic driving device in the embodiment according to the present invention.

DESCRIPTION OF THE PREFERRED EMBODIMENTS

Figure 1:
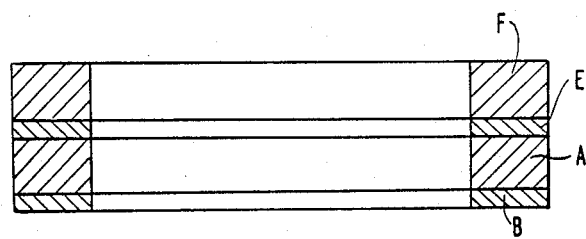
FIG. 1 shows a sectional view of an ultrasonic motor in the prior art.
Figure 2:
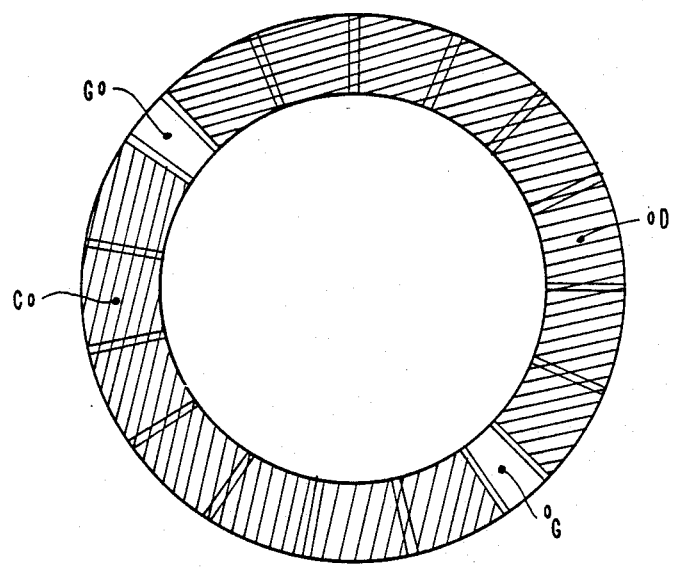
FIG. 2 shows a plane view of a form of a piezoelectric vibrator and a composition of electrodes of the piezoelectric vibrator in the ultrasonic motor in FIG. 1.

Referring to the prior art in FIG. 1, a ring type piezoelectric vibrator B is attached to a ring type resilient member A and the piezoelectric vibrator B vibrates with the resilient member. The piezoelectric vibrator B is divided in 17 parts by the ratio of e.g. 22.5° or 11.25°. The respective neighbouring portions in the 17 parts of the piezoelectric vibrator B are polarized by reverse polarity with respect to each other as shown in FIG. 2. The two portions C and D in one side of the piezoelectric vibrator B are respectively attached as an electrode by conductive paint as shown in FIG. 2. The portion G in FIG. 2 shows an earth electrode. The member F to be driven to which slider E is attached is mounted on the resilient member A.

In the ultrasonic motor in the prior art, the alternating current voltage of $V_o \sin\omega t$ is applied to the one electrode C and the alternating current voltage $V_o \cos\omega t$ is applied to the other electrode D, where $V_o$ is the instantaneous value, $\omega$ is the radian frequency and t is time. The phases of these voltages shift by $\pi/2$ from each other. Thereby, the divided portions of the piezoelectric vibrator B alternatively expand and contract and thus, the resilient member A has a bending vibration. Therefore, a standing wave is generated in the resilient member A and a progressive wave is generated on the resilient member A. Thus, the driven member F having the slider E is rotated on the resilient member A.

However, in the prior ultrasonic motor, because the divided portions of the ring type piezoelectric vibrator B must be alternately polarized and the divided electrodes must be formed on the divided portion of the piezoelectric vibrator B, the composition of the prior ultrasonic motor is complex.

Figure 3:
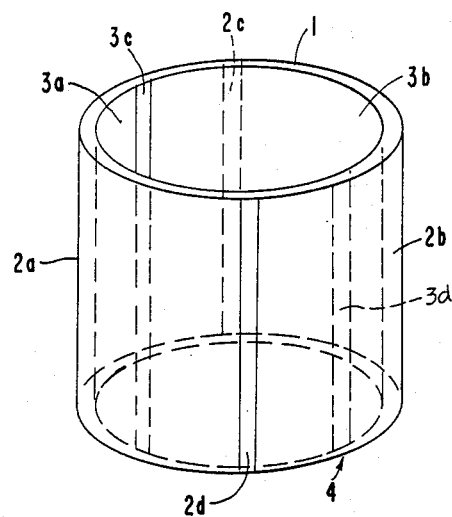
FIG. 3 shows a perspective view of a stator of an ultrasonic driving device in an embodiment according to the present invention.
Figure 4:
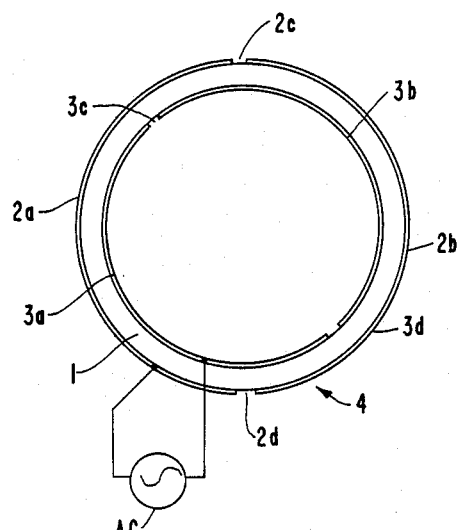
FIG. 4 shows a plane view of a stator in FIG. 3.

Referring to FIGS. 3 and 4, in a stator 4 consisting of a cylindrical piezoelectric vibrator in the embodiment according to the present invention, divided electrodes 2a and 2b are provided on the outside portion of a piezoelectric vibrator a and divided electrodes 3a and 3b are provided on the inside portion of the piezoelectric vibrator a. Gaps 2c and 2d between the divided electrodes 2a and 2b and gaps 3c and 3d between the divided electrodes 3a, 3b are shifted from each other (about 45° in this embodiment). The shifted angle between gaps 2c and 3c or 2d and 3d may be 90°.

Figure 5:
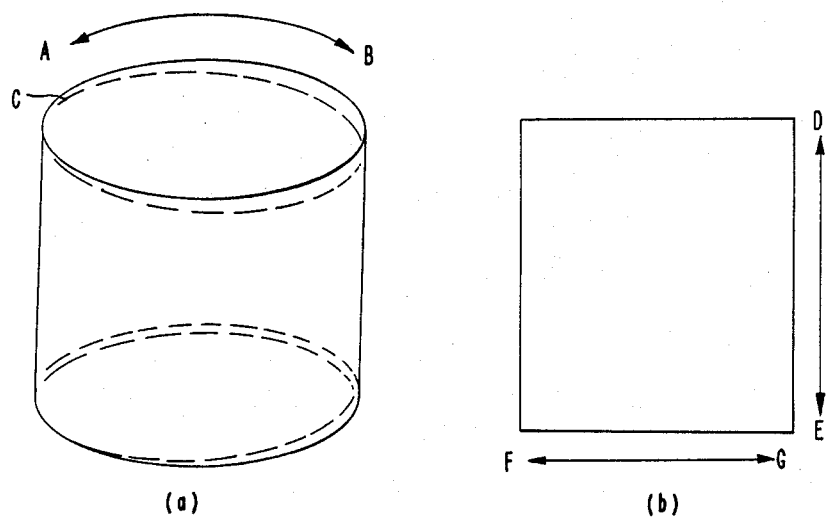
FIG. 5 shows a view for explaining the principle of motion of a stator according to the present invention in FIG. 3.
Figure 5:
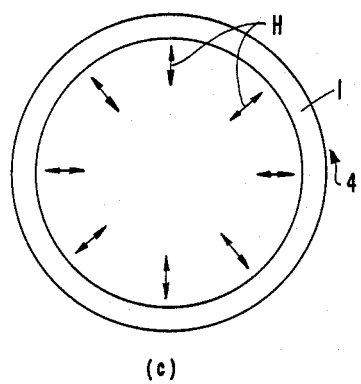

In a stator 4 of this embodiment, when alternating current voltage is applied to the electrodes 2a and 3a, a progressive wave (ellipse vibration) is generated as shown by arrow A in FIG. 5(a). Also, when alternating current voltage is applied to the electrodes 2a and 3b, a progressive wave (ellipse vibration) is reversely generated as shown by arrow B in FIG. 5(a).

Explaining this principle, one half of the cylindrical piezoelectric vibrator is spread as shown in FIG. 5(b) and when the current voltage is applied to the outside electrode 2a and the inside electrode 3a, the piezoelectric vibrator extends toward an arrow DE and shortens toward an arrow FG. Thereby, the diametrical vibration in the cylindrical piezoelectric vibrator generates as shown in arrows H in FIG. 5(c). Therefore, since the portion of the piezoelectric vibrator 1, to which the alternating current voltage is applied, is vibrated by the diametrical vibration and the longitudinal vibration, but the portion of the piezoelectric vibrator to which the voltage is not applied is not vibrated, a twist vibration is generated by the shift of the electrodes 2a and 3a as shown by dotted line C in FIG. 5(a) and a progressive wave (ellipse vibration) generates on the end portion and side portion of the piezoelectric vibrator 1.

Also, when the alternating current voltage is applied to the electrodes 2a and 3b, the progressive wave(ellipse vibration) generates toward the arrow B in FIG. 5(a).

As shown in FIG. 6, when a rotary member 5 is pressed on the end of the stator 4, the rotary member 5 is smoothly rotated by the progressive wave.

In this embodiment, since the rotary member is contacted with an end portion of the solid ceramics of the piezoelectric vibrator and the electrodes 2a, 2b, 3a and 3b are attached on the outside and inside portions, the electrodes need not be protected from wear and tear.

When the rotary member 5 is pressed on the side portion of the stator 4, also the rotary member 5 is smoothly rotated by the progressive wave.

When the gaps 2c and 2d between the outside electrodes 2a and 2b correspond with the gaps 3c and 3d between the inside electrodes 3a and 3b, the progressive wave (ellipse vibration) generates in one direction, but the direction of this progressive vibration is unstable.

As a concrete embodiment, referring to FIG. 7, a rotary shaft 5a of the rotary member 5 is rotatably supported with a bearing 7 mounted on the end wall of the case 6 and a thrust bearing 8 between the end wall of the case 6 and the rotary member 5. The stator 4 is strongly contacted with the rotary member 5 by fixing a bottom plate 10 on the end of the case 6 through a spring 9.

In this embodiment, when the alternating current voltage is applied to the electrodes 2a and 3a or 3b, the progressive wave (ellipse vibration) is reversibly generated on the stator 4 and thereby the rotary member 5 is rotated.

Figure 8:
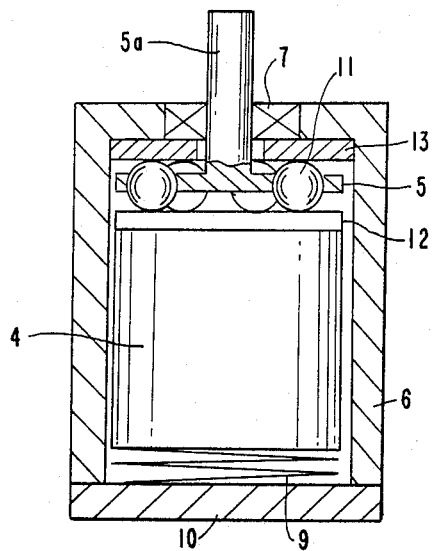
FIG. 8 shows a sectional view of an ultrasonic driving device in another embodiment according to the present invention.

Referring to FIG. 8, a plurality of balls are rotatably attached with the rotary member 5, the rotary shaft 5a is rotatably supported by the bearing 7 mounted on the end wall of the case 6. Then the balls are put between a plate 12 on the stator 5 and a pressure plate 13 in the case 6. The plate 12 of the stator 4 is strongly contacted with the balls of the rotary member 5 by fixing a bottom plate 10 on the end of the case 6 through a spring 9.

In this embodiment, when the alternating current voltage is applied to the electrodes 2a and 3a or 3b the progressive wave (ellipse vibration) is reversibly generated on the stator through the plate 12. When the balls 11 are rotated by the progressive wave on the plate 12, the balls 11 are rolled and moved on the pressure plate 13 and thereby the rotary member 5 is rotated.

Figure 9:
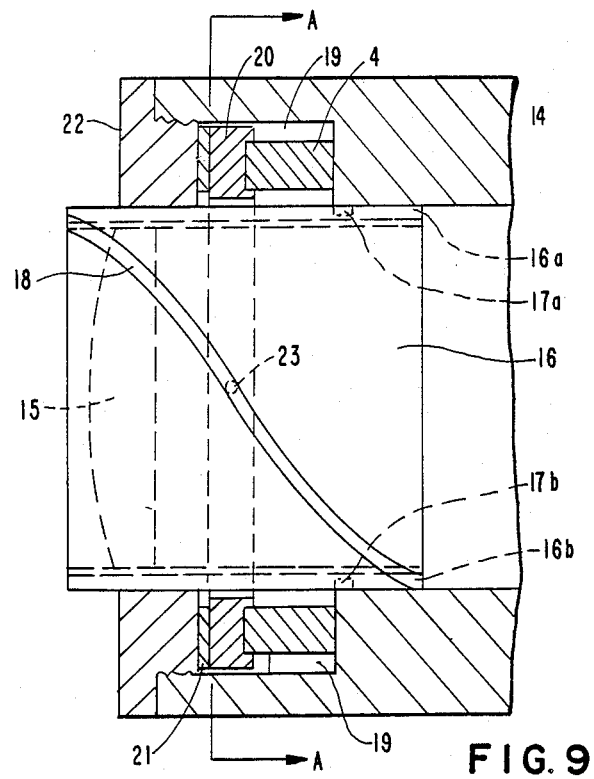
FIGS. 9 shows a side sectional view of a frame of a camera using an ultrasonic driving device according to the present invention.
Figure 10:
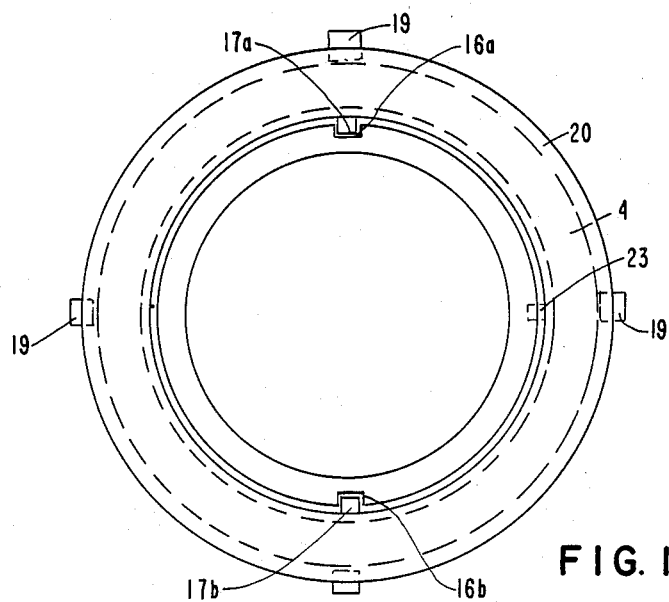
FIG. 10 shows a sectional view taken about line A—A in the frame of the camera in FIG. 9.

Referring to FIG. 9 and FIG. 10 a frame 16 in which lenses 15 are mounted is inserted into a hole of a case 14, two projections 17a and 17b are engaged with two grooves 16a and 16b and a spiral groove 18 is formed on the outside of the frame 16. The ring type stator 4 is supported by projections 19 in the inside of the case 14 and a ring type rotary member 20 is contacted with the stator 4. A screw of a ring type flange member 22 is engaged with a screw of the case 14 and presses the rotary member 20 through a spring washer 21. A projection 23 in the inside of the rotary member 20 is engaged with the spiral groove 18.

In the above camera having the stator 4 according to the present invention, when the alternating current voltage is applied to the stator 4 as stated above, the rotary member 20 is rotated by the progressive wave generated on the end of the stator 4. Since the rotary torque of the rotary member 20 is large, the frame 16 is moved toward the right or left in FIG. 9 by moving the projection of the rotary member in the spiral groove 18. Also, since the rotary member 20 is pressed on the stator 4 with the spring washer 21, when the power is taken off, the rotary member 20 is stopped in this position. Therefore, there is no necessity for providing any mechanical member for stopping the rotary member 20.

Figure 11:
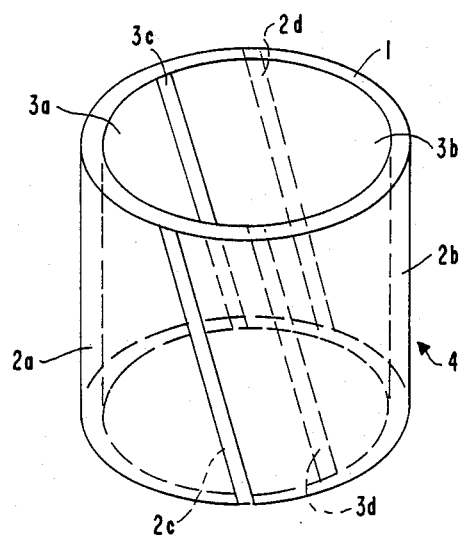
FIG. 11 shows a perspective view of a stator of an ultrasonic driving device in another embodiment according to the present invention.

Referring to FIG. 11, the gaps 2c and 2d between the electrodes 2a and 2b and gaps 3c and 3c between the electrodes 3a and 3b are oblique to the side face of the cylindrical piezoelectric vibrator 1.

In this embodiment, when the alternating current voltage is applied to the electrodes 2a and 3a or 3b, the progressive wave reversibly generates on the end and side portions of the stator 4.

What is claimed is:

1. An ultrasonic driving device comprising:
   a stator including a cylindrical piezoelectric vibrator;
   inner divided electrodes secured to an inside portion of the cylindrical piezoelectric vibrator, with first gaps therebetween
   outer divided electrodes secured to an outside portion of the cylindrical piezoelectric vibrator, with second gaps therebetween;
   said first and second gaps being shifted from each other;
   an alternating current (AC) power supply connected to respective ones of the divided electrodes on the inside and outside portions of the cylindrical piezoelectric vibrator; and
   a rotary member combined with an end or side portion of the stator.

2. An ultrasonic driving device comprising:
   a stator including a cylindrical piezoelectric vibrator;
   inner divided electrodes secured to an inside portion of the cylindrical piezoelectric vibrator, with first gaps therebetween
   outer divided electrodes secured to an outside portion of the cylindrical piezoelectric vibrator, with second gaps therebetween;
   said first and second gaps being shifted from each other; by 45°;
   an alternating current (AC) power supply connected to respective ones of the divided electrodes on the inside and outside portions of the cylindrical piezoelectric vibrator; and a rotary member combined with an end or side portion of the stator.

3. An ultrasonic driving device comprising:
a stator including a cylindrical piezoelectric vibrator;
inner divided electrodes secured to an inside portion of the cylindrical piezoelectric vibrator, with first gaps therebetween;
outer divided electrodes secured to an outside portion of the cylindrical piezoelectric vibrator, with second gaps therebetween;
said first and second gaps being shifted from each other by 90°;
an alternating current (AC) power supply connected to respective ones of the divided electrodes on the inside and outside portions of the cylindrical piezoelectric vibrator; and
a rotary member combined with an end or side portion of the stator.

4. An ultrasonic driving device comprising:
a stator including a cylindrical piezoelectric vibrator;
inner divided electrodes secured to an inside portion of the cylindrical piezoelectric vibrator with first gaps therebetween;
outer divided electrodes secured to an outside portion of the cylindrical piezoelectric vibrator, with second gaps therebetween;
said first and second gaps being shifted from each other and being oblique;
an alternating current (AC) power supply connected to respective ones of the divided electrodes on the inside and outside portions of the cylindrical piezoelectric vibrator; and
a rotary member combined with an end or side portion of the stator.

5. An ultrasonic driving device according to claim 1; further comprising:
a case having bearing means therein;
a rotary member having a rotary shaft rotably supported with the bearing means in the case;
a thrust bearing positioned between an inside portion of the case and the rotary member; and
wherein said stator is in contact with the rotary member.

6. An ultrasonic driving device according to claim 1; further comprising:
a case having bearing means therein;
a rotary member having a rotary shaft rotably supported by said bearing means and a plurality of balls rotably supported therein;
a thrust plate positioned between an inside portion of the case and the balls of the rotary member; and
wherein said stator is in contact with the balls of the rotary member.

7. An ultrasonic driving device according to claim 1; further comprising;
a case having projections;
a ring tight rotary member rotably supported in the case;
a spring washer in the case;
a flange member which presses the ring-type rotary member through the spring washer;
a cylindrical frame having lenses, a side portion with grooves therein which receive the projections of the case for supporting the cylindrical frame, and a spiral groove on an outside portion of the frame engaged with a projection of the ring-type rotary member, such that the cylindrical frame is axially moved when the rotary member is rotated by the stator; and
wherein said stator is supported by the projections in the case.

8. An ultrasonic driving device comprising:
a stator including a cylindrical piezoelectric vibrator;
inner divided electrodes secured to an inside portion of the cylindrical piezoelectric vibrator, with first gaps therebetween
outer divided electrodes secured to an outside portion of the cylindrical piezoelectric vibrator, with second gaps therebetween;
said first and second gaps being shifted from each other; and said first and second gaps extending in a direction having an axial component;
an alternating current (AC) power supply connected to respective ones of the divided electrodes on the inside and outside portions of the cylindrical piezoelectric vibrator; and
a rotary member combined with an end or side portion of the stator.

* * * * *